(12) United States Patent
Ma et al.

(10) Patent No.: US 8,360,485 B2
(45) Date of Patent: Jan. 29, 2013

(54) HOLDING MECHANISM AND ELECTRONIC DEVICE USING THE SAME

(75) Inventors: Xian-Wei Ma, Shenzhen (CN); Ting Luo, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 230 days.

(21) Appl. No.: 12/889,419

(22) Filed: Sep. 24, 2010

(65) Prior Publication Data

US 2011/0267744 A1 Nov. 3, 2011

(30) Foreign Application Priority Data

Apr. 29, 2010 (CN) .......................... 2010 1 0160010

(51) Int. Cl.
*E05B 63/20* (2006.01)
*E05C 1/04* (2006.01)
(52) U.S. Cl. ........ 292/333; 292/137; 292/145; 292/150; 292/332; 292/DIG. 37; 429/97
(58) Field of Classification Search .................... 429/96, 429/97, 100; 292/137, 138, 140, 145–147, 292/150, 151, 163, 164, 168, 169, 169.13, 292/169.14, 170, 174, 175, 253, 254, 300, 292/302, 332, 333, DIG. 37, DIG. 51, DIG. 53, 292/DIG. 54, DIG. 61; 361/679.37–679.39, 361/679.58

See application file for complete search history.

(56) References Cited

U.S. PATENT DOCUMENTS

| | | | | |
|---|---|---|---|---|
| 1,483,474 A | * | 2/1924 | Ohnstrand | 109/59 R |
| 1,816,134 A | * | 7/1931 | Wood | 292/333 |
| 1,880,636 A | * | 10/1932 | Wood | 292/164 |
| 1,965,939 A | * | 7/1934 | Jacobi | 70/81 |
| 3,621,686 A | * | 11/1971 | Klein | 70/157 |
| 4,146,682 A | * | 3/1979 | Nakao | 429/97 |
| 4,179,143 A | * | 12/1979 | Shy | 292/179 |
| 5,140,138 A | * | 8/1992 | Tanaka | 235/1 D |
| 5,645,954 A | * | 7/1997 | Tamaru | 429/100 |
| 5,686,810 A | * | 11/1997 | Yasui | 320/113 |
| 5,692,208 A | * | 11/1997 | Felcman et al. | 361/679.38 |
| 5,716,730 A | * | 2/1998 | Deguchi | 429/97 |
| 5,825,616 A | * | 10/1998 | Howell et al. | 361/679.38 |
| 5,836,625 A | * | 11/1998 | Kibble | 292/145 |
| 5,889,649 A | * | 3/1999 | Nabetani et al. | 361/679.38 |

(Continued)

FOREIGN PATENT DOCUMENTS

| | | |
|---|---|---|
| CN | 1824393 A | 8/2006 |
| CN | 201334150 Y | 10/2009 |

*Primary Examiner* — Carlos Lugo
*Assistant Examiner* — Alyson M Merlino
(74) *Attorney, Agent, or Firm* — Altis Law Group, Inc.

(57) ABSTRACT

An electronic device with a holding mechanism is provided. The device includes a main body, a housing, a carriage, a first elastic member, a stopper member, a second elastic member, and a button. The housing includes a first sidewall, a second sidewall opposite to the first sidewall, and a third sidewall formed between the first sidewall and the second sidewall, an opening is defined in the second sidewall. The stopper member is slidably received in the housing and connected to the third sidewall. The carriage is slidably received in the housing and connected to the first sidewall. The ridge protrudes from the carriage and is capable of blocking a free end of the stopper member to retain the carriage in a retracted position. The button is slidably connected to the housing and includes a distal end, which engages with the stopper member.

12 Claims, 5 Drawing Sheets

U.S. PATENT DOCUMENTS

| | | | | |
|---|---|---|---|---|
| 6,302,454 | B1 * | 10/2001 | Tsurumaru et al. | 292/175 |
| 6,643,139 | B2 * | 11/2003 | Tien | 361/727 |
| 7,009,836 | B2 * | 3/2006 | Lo | 361/679.55 |
| 7,009,837 | B2 * | 3/2006 | Lo | 361/679.55 |
| 7,165,791 | B2 * | 1/2007 | Rebel et al. | 292/137 |
| 7,261,342 | B2 * | 8/2007 | Smith | 292/332 |
| 7,510,796 | B2 * | 3/2009 | Tokano | 429/96 |
| 7,564,215 | B2 * | 7/2009 | Wang et al. | 320/107 |
| 7,733,643 | B1 * | 6/2010 | Rumpf | 361/679.43 |
| 7,817,414 | B2 * | 10/2010 | Chou et al. | 361/679.41 |
| 8,026,451 | B2 * | 9/2011 | Lai | 174/542 |
| 8,081,447 | B2 * | 12/2011 | Yu | 361/679.55 |
| 8,085,530 | B2 * | 12/2011 | Zhang et al. | 361/679.33 |
| 8,189,327 | B2 * | 5/2012 | Chang | 361/679.31 |
| 2002/0093792 | A1 * | 7/2002 | Cheng | 361/704 |
| 2006/0245160 | A1 * | 11/2006 | Zhang et al. | 361/685 |
| 2007/0243457 | A1 * | 10/2007 | Viduya et al. | 429/96 |
| 2007/0274034 | A1 * | 11/2007 | Yang et al. | 361/685 |
| 2010/0086840 | A1 * | 4/2010 | Shao | 429/97 |

* cited by examiner

HOLDING MECHANISM AND ELECTRONIC DEVICE USING THE SAME

BACKGROUND

1. Technical Field

The present disclosure relates to an electronic device and a holding mechanism applied therein.

2. Description of the Related Art

Components of an electronic device, such as a battery, an internal optical disc drive, SD-cards, and like this, are usually fixed in the electronic device. A mechanical holding mechanism is often used for fixing those components in the electronic device and ejecting them from the device in response to user's operations. However, a conventional mechanical holding mechanism often needs exact and unerring operations that confuse users.

Therefore, what is needed is a holding mechanism applied in an electronic device to overcome the above-mentioned shortcomings.

BRIEF DESCRIPTION OF THE DRAWINGS

The components in the drawings are not necessarily drawn to scale, the emphasis instead being placed upon clearly illustrating the principles of a holding mechanism. Moreover, in the drawings, like reference numerals designate corresponding parts throughout the several views.

DETAILED DESCRIPTION

Figure 1:
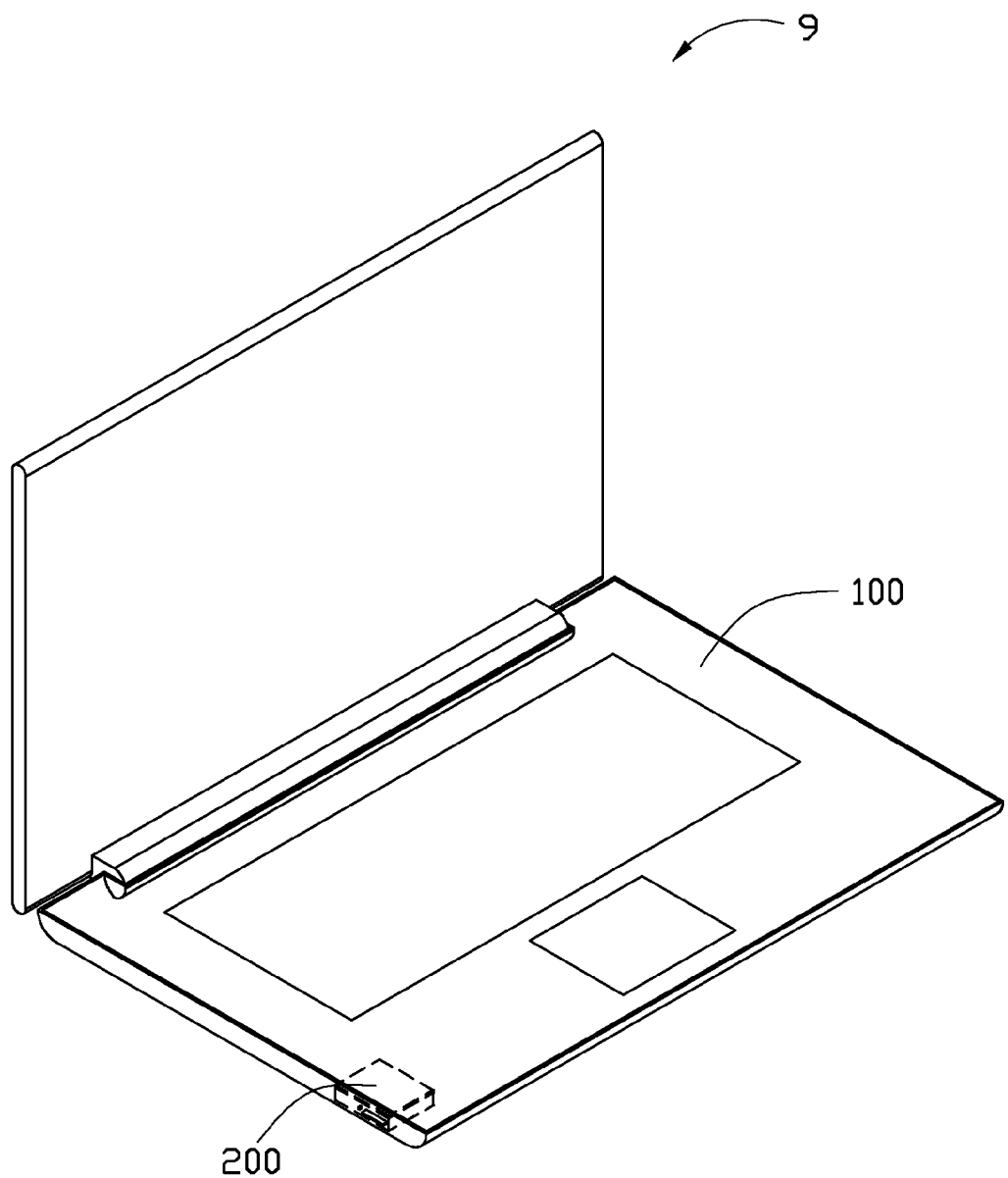
FIG. 1 is a perspective view of an electronic device employing a holding mechanism in accordance with an exemplary embodiment.

Referring to FIG. 1, an electronic device 9 includes a main body 100 and a holding mechanism 200 mounted in the main body 100. In the exemplary embodiment, the device 9 is a notebook computer. In an alternative embodiment, the device 9 can be, for example, a mobile phone, an e-reader, a PDA, or the like. The holding mechanism 200 is configured to hold a battery, an SD card, an internal optical disc drive, or a wireless card in the device 9.

Figure 2:
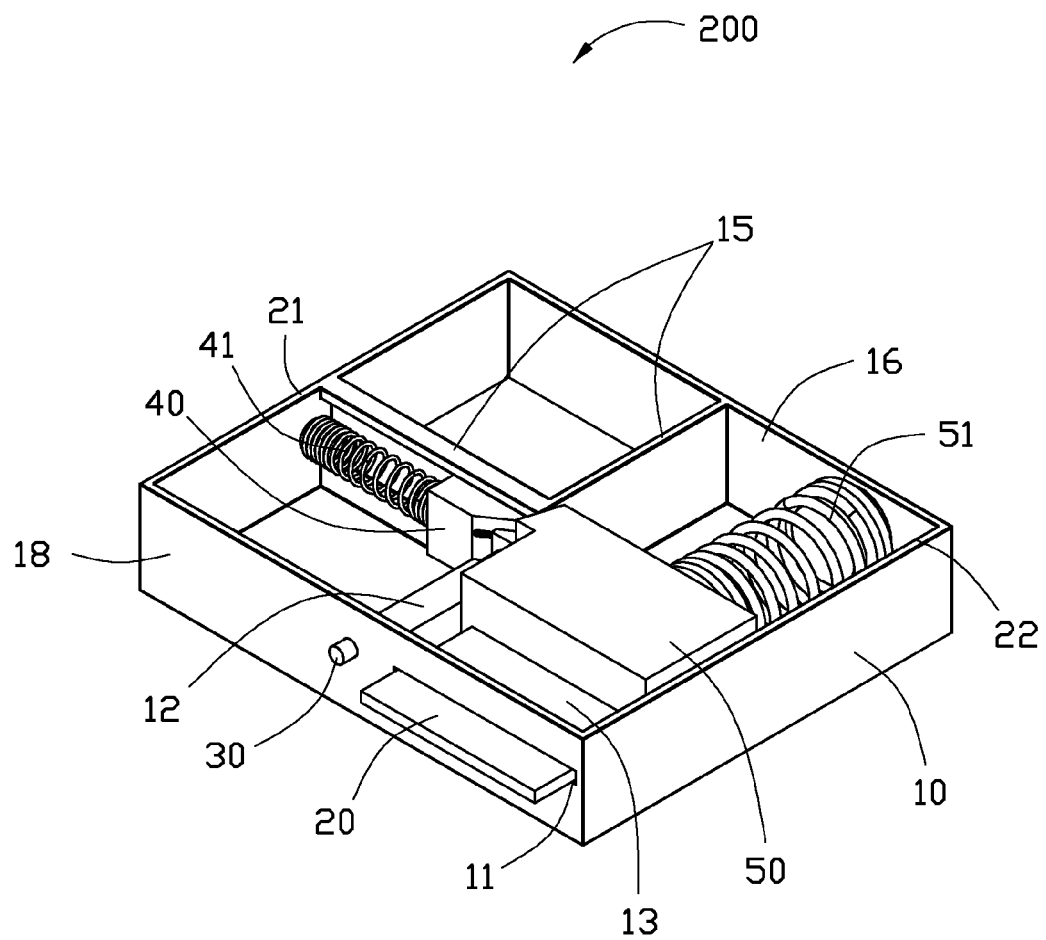
FIG. 2 is a perspective view of the holding mechanism of FIG. 1.

Referring to FIG. 2, the holding mechanism 200 includes a housing 10, a stopper member 40, a first elastic member 41, a carriage 50, a second elastic member 51, and a button 30.

Figure 3:
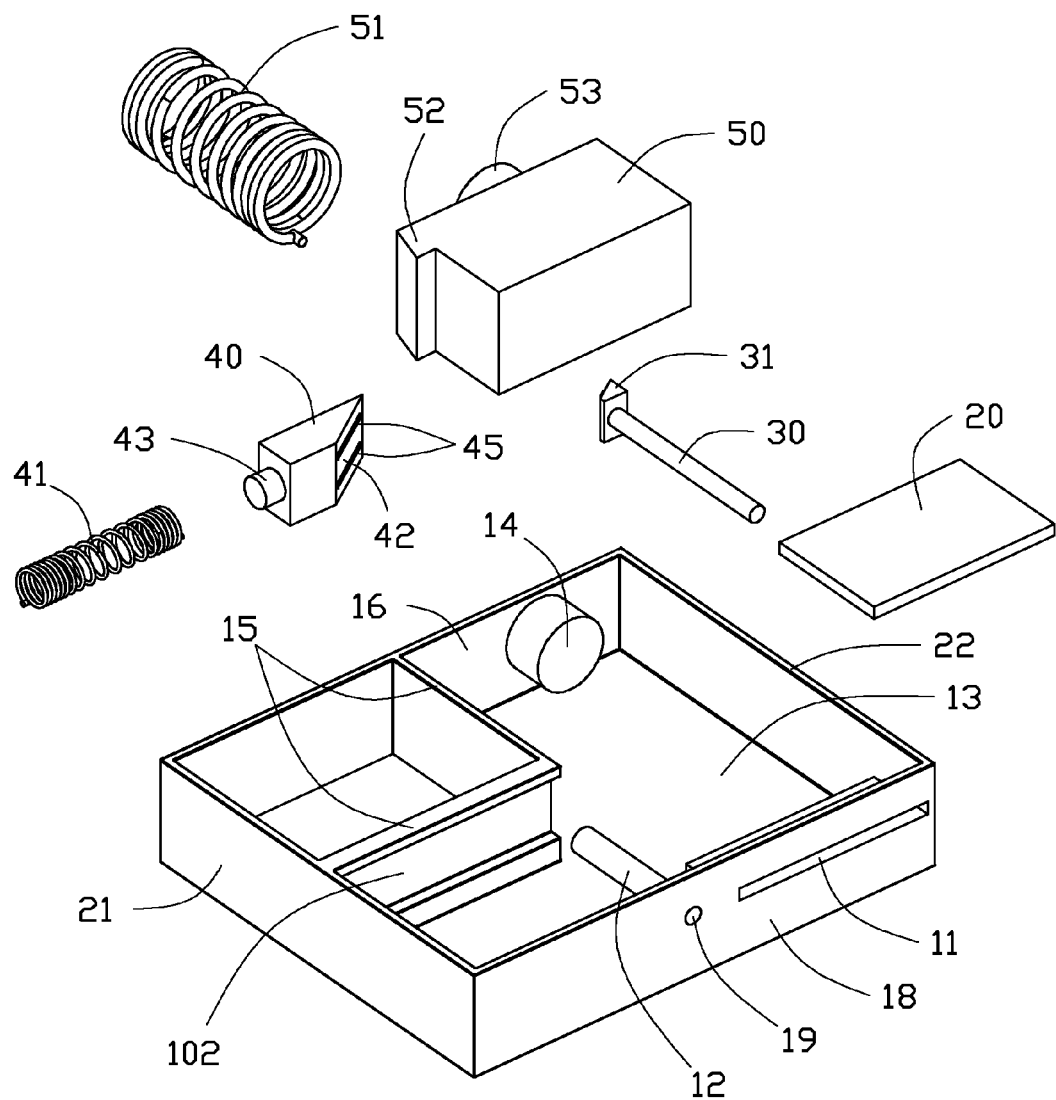
FIG. 3 is an exploded, perspective view of the holding mechanism of FIG. 1.

Referring to FIG. 3, an L-shaped wall 15 protrudes from the bottom of the housing 10, and cooperates with sidewalls of the housing 10 to form an L-shaped accommodating space 13. In this embodiment, the housing 10 includes a first sidewall 16, a second sidewall 18 opposite to the first sidewall 16, a third sidewall 21, and a fourth sidewall 22 formed between the first sidewall 16 and the second sidewall 18, and an opening 11 is defined in the second sidewall 18. The L-shaped wall 15 is connected to the first sidewall 16 and the third sidewall 21 to form the L-shaped accommodating space 13 with all the sidewalls 16, 18, 21 and 22.

The space 13 accommodates the stopper member 40, the first elastic member 41, the carriage 50, the second elastic member 51, and the button 30 (shown in FIG. 2). A sliding groove 102 is defined in the L-shaped wall 15, communicating with the L-shaped accommodating space 13. The stopper member 40 is slidably received in the sliding groove 102 through the first elastic member 41. The carriage 50 is slidably connected to the first sidewall 16 by the second elastic member 51. The button 30 is configured to move the stopper member 40 along the sliding groove 102.

One end of the first elastic member 41 is fixed on a protrusion 43 of the stopper member 40, and the other end of the first elastic member 41 is fixed on the third sidewall 21. A bushing 12 protrudes from an inner surface of the second sidewall 18 and is configured for receiving the button 30. One end of the button 30 passes through an assembly hole 19 defined in the second sidewall 18.

One end of the second elastic member 51 is fixed on a first protrusion 14 protruding from an inner surface of the first sidewall 16, and the other end of the second elastic member 51 is fixed on a second protrusion 53 protruding from the carriage 50.

The carriage 50 is slidably received in the accommodating space 13 of the housing 10. A ridge 52 protruding from the carriage 50 abuts against one free end of the stopper member 40, to retain the carriage 50 in the accommodating space 13 in a retracted position. In the embodiment, the carriage 50 is configured for receiving a battery 20 through the opening 11. The carriage 50 is also an electrode connector for electrically connecting to the battery 20. In an alternative embodiment, the carriage 50 can be a CD driver for receiving a CD-ROM, or a connector for fixing a SD card or a wireless card in the device 9.

Figure 4:
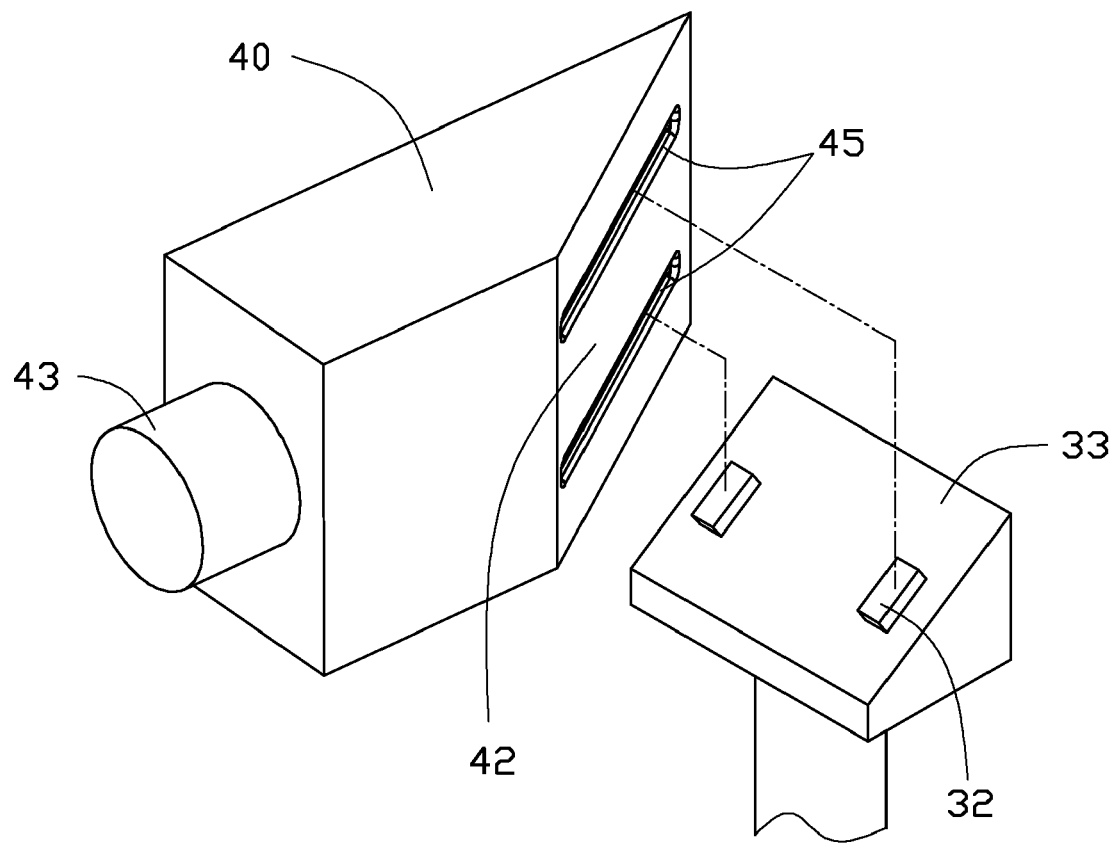
FIG. 4 is an isometric view of a stopper member and a button of the holding mechanism of FIG. 1.

Referring to FIG. 4, the stopper member 40 includes a first sloping surface 42 that defines two restriction slots 45. The slots 45 are substantially parallel to each other. The button 30 includes a distal end 31. A second sloping surface 33 is defined on the distal end 31. Two projecting portions 32 protrude from the second sloping surface 33. The first sloping surface 42 and the second sloping surface 33 abut against each other. The projecting portions 32 are slidably received in the two restriction grooves 45.

Figure 5:
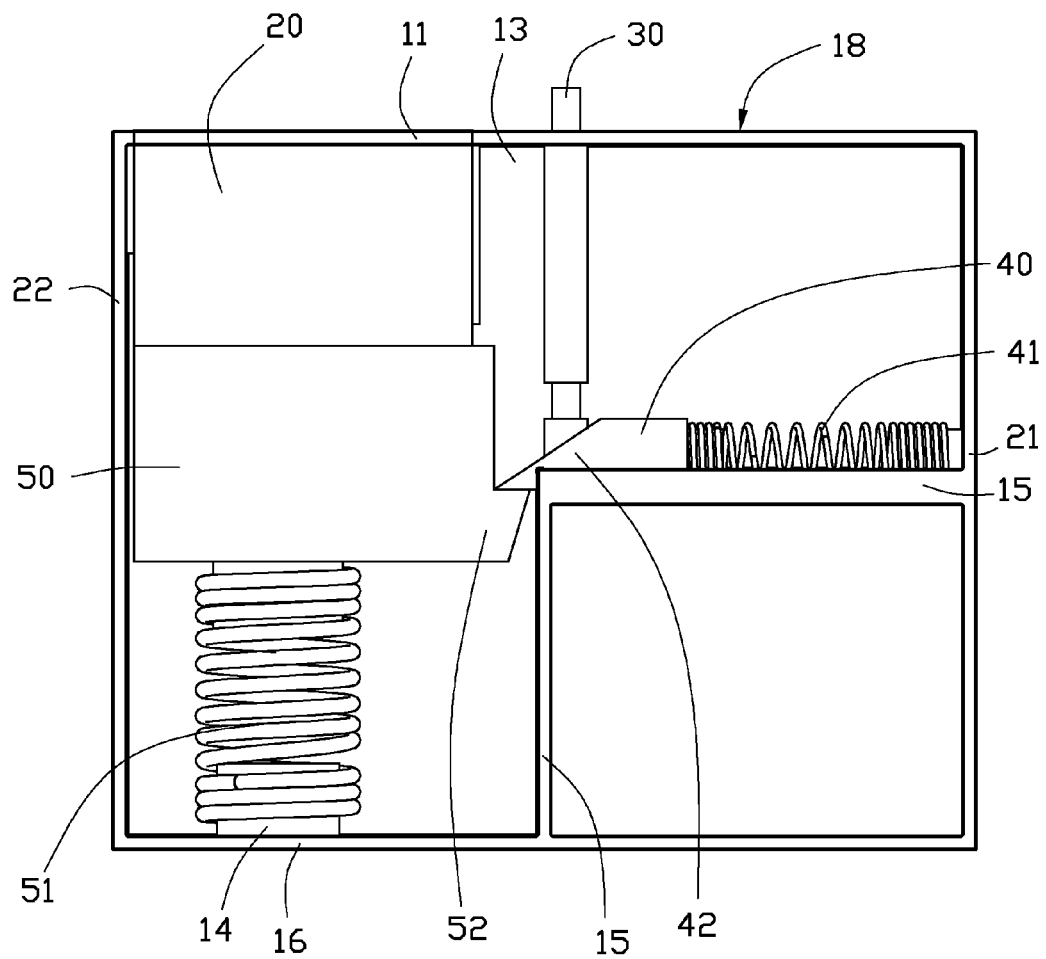
FIG. 5 is a planar view showing the holding mechanism of FIG. 1.

Referring to FIG. 5, normally, the battery 20 is retained in the carriage 50. To remove the battery 20, the button 30 is pushed into the housing 100. The stopper member 40 is then urged by the button 30 to move away from the carriage 50. During the process, the first elastic member 41 is compressed. After the stopper member 40 disengages from the carriage 50, the second elastic member 51 pushes the carriage 50 to eject the battery 20 fixed in the carriage 50 out through the opening 11.

To install the battery 20 in the device 9, the battery 20 is pushed through the opening 11 to drive the carriage 50, and the carriage 50 pushes and compresses the second elastic member 51. At the same time, the carriage 50 also applies force to the stopper member 40, and the stopper member 40 pushes and compresses the first elastic member 41. Finally, the stopper member 40 blocks the carriage 50 when a restoring force of the first elastic member 40 pulls the end of the stopper member 40 to insert into the ridge 52. Therefore, the battery 20 is inserted into the carriage 50 and fixed in the device 9.

It is understood that the disclosure may be embodied in other forms without departing from the spirit thereof. Thus, the present examples and embodiments are to be considered in all respects as illustrative and not restrictive, and the disclosure is not to be limited to the details given herein.

What is claimed is:

1. An electronic device comprising:
   a main body; and
   a holding mechanism arranged in the main body, comprising:
   a housing comprising a first sidewall, a second sidewall opposite to the first sidewall, and a third sidewall formed between and connecting the first sidewall and the second sidewall, an opening defined in the second sidewall;
   a stopper member slidably received in the housing and connected to the third sidewall through a first elastic member, the stopper member comprising a sloping free end;
   a carriage slidably received in the housing and connected to the first sidewall through a second elastic member; a ridge protruding from the carriage, and the carriage capable of being blocked by the sloping free end of the stopper member engaging with the ridge to retain the carriage in a retracted position; and
   a button slidably connected to the housing and comprising a distal end, the distal end engaging with the stopper member;
   wherein, pushing of the button pushes the stopper member to compress the first elastic member to move the sloping free end of the stopper member to disengage from the ridge, such that the second elastic member pushes the carriage away from the retracted position and drives the carriage towards the opening, when an external force is applied to the carriage to move the carriage away from the opening, the carriage compresses the second elastic member and applies force to the stopper member by the ridge engaging with the sloping free end of the stopper member, such that the stopper member compresses the first elastic member, when the carriage is moved towards the retracted position, the first elastic member rebounds to move the stopper member to block the carriage by the sloping free end of the stopper member engaging with the ridge to retain the carriage in the retracted position.

2. The electronic device as claimed in claim 1, wherein an L-shaped wall protrudes from a bottom of the housing, and cooperates with the first sidewall and the third sidewall of the housing to form an L-shaped accommodating space for receiving the stopper member, the first elastic member, the carriage, the second elastic member, and the button.

3. The electronic device as claimed in claim 2, wherein a sliding groove is defined in the L-shaped wall, the stopper member is slidably received in the sliding groove.

4. The electronic device as claimed in claim 1, wherein at least one restriction slot is defined in the stopper member, and at least one projecting portion protruding from the distal end of the button is slidably received in the at least one restriction slot.

5. The electronic device as claimed in claim 4, wherein a first sloping surface is defined on the sloping free end of the stopper member, and the at least one restriction slot is defined in the first sloping surface; the distal end of the button comprises a second sloping surface that engages with the first sloping surface, and the at least one projecting portion is formed on the second sloping surface.

6. The electronic device as claimed in claim 1, wherein a bushing protrudes from an inner surface of the second sidewall, and is configured for receiving the button, and one end of the button extends through an assembly hole defined in the second sidewall.

7. A holding mechanism mounted in a main body of an electronic device, comprising:
   a housing comprising a first sidewall, a second sidewall opposite to the first sidewall, and a third sidewall formed between and connecting the first sidewall and the second sidewall, an opening defined in the second sidewall;
   a stopper member slidably received in the housing and connected to the third sidewall through a first elastic member, the stopper member comprising a sloping free end;
   a carriage slidably received in the housing and connected to the first sidewall through a second elastic member; a ridge protruding from the carriage and the carriage capable of being blocked by the sloping free end of the stopper member engaging with the ridge to retain the carriage in a refracted position; and
   a button slidably connected to the housing and comprising a distal end, the distal end engaging with the stopper member;
   wherein, pushing of the button pushes the stopper member to compress the first elastic member to move the sloping free end of the stopper member to disengage from the ridge, such that the second elastic member pushes the carriage away from the retracted position and drives the carriage towards the opening, when an external force is applied to the carriage to move the carriage away from the opening, the carriage compresses the second elastic member and applies force to the stopper member by the ridge engaging with the sloping free end of the stopper member, such that the stopper member compresses the first elastic member, when the carriage is towards the retracted position, the first elastic member rebounds to move the stopper member to block the carriage by the sloping free end of the stopper member engaging with the ridge to retain the carriage in the retracted position.

8. The holding mechanism as claimed in claim 7, wherein an L-shaped wall protrudes from a bottom of the housing, and cooperates with the first sidewall and the third sidewall of the housing to form an L-shaped accommodating space for receiving the stopper member, the first elastic member, the carriage, the second elastic member, and the button.

9. The holding mechanism as claimed in claim 8, wherein a sliding groove is defined in the L-shaped wall, the stopper member is slidably received in the sliding groove.

10. The holding mechanism as claimed in claim 8, wherein at least one restriction slot is defined in the stopper member, and at least one projecting portion protruding from the distal end of the button is slidably received in the at least one restriction slot.

11. The holding mechanism as claimed in claim 10, wherein a first sloping surface is defined on the sloping free end of the stopper member, and the at least one restriction slot is defined in the first sloping surface; the distal end of the button comprises a second sloping surface that engages with the first sloping surface, and the at least one projecting portion is formed on the second sloping surface.

12. The holding mechanism as claimed in claim 8, wherein a bushing protrudes from an inner surface of the second sidewall, and is configured for receiving the button, and one end of the button extends through an assembly hole defined in the second sidewall.

* * * * *